United States Patent
Hashizume

[19]

[11] Patent Number: 6,147,817
[45] Date of Patent: *Nov. 14, 2000

[54] OPTICAL MODULE

[75] Inventor: Hideki Hashizume, Sagamihara, Japan

[73] Assignee: Nippon Sheet Glass Co., Ltd., Osaka, Japan

[*] Notice: This patent is subject to a terminal disclaimer.

[21] Appl. No.: 09/203,028

[22] Filed: Dec. 1, 1998

Related U.S. Application Data

[63] Continuation-in-part of application No. 09/094,774, Jun. 15, 1998, Pat. No. 5,973,862.

[30] Foreign Application Priority Data

Dec. 11, 1997 [JP] Japan .................................. 9-362025

[51] Int. Cl.[7] .................................................. G02B 7/02
[52] U.S. Cl. .............................................. 359/819; 385/33
[58] Field of Search ................................ 359/819; 385/33, 385/35, 74, 92, 93, 88

[56] References Cited

U.S. PATENT DOCUMENTS

| | | | |
|---|---|---|---|
| 3,904,277 | 9/1975 | Phillips et al. ................... | 350/252 |
| 4,707,067 | 11/1987 | Haberland et al. ............... | 350/96.2 |
| 5,333,224 | 7/1994 | Kimihiro ........................... | 385/93 |
| 5,347,604 | 9/1994 | Go et al. ........................... | 385/92 |
| 5,388,171 | 2/1995 | Michikoshi et al. ............. | 385/36 |
| 5,737,465 | 4/1998 | Okochi ............................. | 385/88 |
| 5,757,999 | 5/1998 | Tabuchi et al. .................. | 385/93 |
| 5,973,862 | 10/1999 | Hashizume ....................... | 359/819 |

*Primary Examiner*—Georgia Epps
*Assistant Examiner*—Tim Thompson
*Attorney, Agent, or Firm*—Merchant & Gould P.C.

[57] ABSTRACT

An optical module has a housing of synthetic resin, a semiconductor device supported by the housing, and a spherical lens held in the housing. The housing has a plurality of teeth holding the spherical lens press-fitted between the teeth. Each of the teeth has a radially inner surface made up of at least three curved surfaces. The three curved surfaces include a first curved surface serving as a lens seat surface for positioning the spherical lens, the lens seat surface having a radius of curvature which is the same as the radius of the spherical lens, a second intermediate curved surface serving as a non-contact surface held out of contact with the spherical lens when the spherical lens is press-fitted between the teeth, the non-contact surface having a radius of curvature smaller than the radius of the spherical lens, and a third curved surface serving as a lens presser surface for smoothly introducing the spherical lens between the teeth. The third curved surface is curved in a direction opposite to the first and second curved surfaces. Each of the teeth has a radially outer surface inclined such that the proximal end thereof is spread radially outwardly from the distal end thereof. The housing has a portion which surrounds the teeth and is recessed to a large depth, and the radially outer surface of each of the teeth has a round surface at the proximal end thereof.

6 Claims, 2 Drawing Sheets

OPTICAL MODULE

This application is a Continuation-In-Part of application Ser. No. 09/094,774, now U.S. Pat. No. 5,973,862 filed Jun. 15, 1998, which application is incorporated herein by reference.

BACKGROUND OF THE INVENTION

1. Field of the Invention

The present invention relates to an optical module having a semiconductor light-emitting device or a semiconductor light-detecting device and a lens which are coaxially aligned with each other in a housing of synthetic resin, and more particularly to an optical module having a spherical lens held in position by a plurality of teeth integrally formed with and disposed in a housing of synthetic resin.

2. Description of the Related Art

Optical modules have a semiconductor device, which may be a semiconductor light-emitting device such as a semiconductor laser or a semiconductor light-detecting device such as a photodiode, and a lens which are coaxially aligned with each other. The optical modules are used in the field of optical communications. In computer systems for data communications, for example, an optical module having a semiconductor light-emitting device and an optical module having a semiconductor light-detecting device are paired on a board. Each of such optical modules comprises a semiconductor device, a lens, and a housing which holds the semiconductor device and the lens and includes a structure for fittingly holding the ferrule of an optical plug to be connected thereto. When the optical plug is connected to the optical module, the semiconductor device is optically coupled to the optical fiber in the ferrule by the lens. The housing generally comprises a holder for holding the semiconductor device and the lens and a receptacle for fittingly holding the ferrule of the optical plug. The holder and the receptacle are separately manufactured, and subsequently secured to each other for coaxial alignment.

Lenses incorporated in optical modules are mostly spherical lenses because they can easily and inexpensively be manufactured to high accuracy only by mechanical machining processes and they can easily be assembled in place without any orientational adjustment as they have no directionality. A spherical lens may be fixed to a holder by a bonding process or a fusion process. According to the bonding process, the lens is placed into and positioned in a recess in the holder, and thereafter a resin adhesive is applied to a surrounding surface of the lens and then thermoset. According to the fusion process, after the lens is placed into and positioned in the recess in the holder, a ring-shaped body made of glass having a low melting point, which is slightly greater than the outside diameter of the lens, is inserted around the lens and then melted with heat.

The bonding process presents a handling problem before the resin adhesive is thermoset because the resin adhesive in a liquid state is poured into a small region around the lens. Another problem is that since the holder is usually made of metal, the bonded surface of the lens tends to thermally crack due to the difference between the coefficients of thermal expansion of the lens and the holder.

The fusion process is also disadvantageous in that the lens suffers devitrification when left at high temperature and high humidity, the bonding strength is poor, and the cost is high. The ring-shaped body made of glass having a low melting point is produced by pressing a powder of low-melting-point glass to shape. Therefore, when the ring-shaped body is placed into position around the lens, fine fragments or powder particles from the ring-shaped body are apt to be scattered and attached to the lens surface. If the ring-shaped body is melted with heat to secure the lens in position, the fine fragments or powder particles attached to the lens surface are fused, and the glass of the ring-shaped body flows around, producing a local film of low-melting-point glass on the lens surface. Inasmuch as the low-melting-point glass is not highly resistant to humidity, it is often subject to devitrification with time, and the devitrified glass is responsible for a reduction in the intensity of light passing through the lens. The surface of the low-melting-point glass around the lens is liable to be fragile due to minute cracks that have been developed therein by humidity, thus lowering the strength with which the lens is secured to the point where the lens may possibly fall off the holder. A separate humidity resistance scheme is necessary to eliminate these shortcomings. This, together with the fact that the ring-shaped body of low-melting-point glass is expensive, leads to an increase in the overall cost of the optical module.

The inventor of the present invention has proposed an optical module comprising a lens holder for securely holding a lens as disclosed in the U.S. patent application Ser. No. 09/094,774. The lens holder of the disclosed optical module comprises a plurality of teeth and a lens seat surface which are integrally formed with a housing of synthetic resin. The disclosed optical module does not need any resin adhesive and fusible glass because a lens is press-fitted into position in the holder. The disclosed optical module is also advantageous in that the lens can quickly and easily be secured in position in the housing, the optical module is highly weather-resistant, highly reliable, and can be manufactured inexpensively.

SUMMARY OF THE INVENTION

It is therefore an object of the present invention to provide an optical module with a press-fitted spherical lens, which allows the spherical lens to be press-fitted with ease, gripped in position with increased forces, and positioned highly accurately, and have a plurality of teeth of increased mechanical strength for holding the spherical lens.

According to the present invention, an optical module includes a housing of synthetic resin, a semiconductor device supported by the housing, and a spherical lens held in the housing. The housing may include a portion for fittingly holding a ferrule of an optical plug to be connected thereto, so that when the optical plug is connected to the housing, the semiconductor device and an optical fiber in the ferrule are optically coupled to each other by the spherical lens. The housing has a plurality of teeth angularly spaced around an optical axis of the housing and having respective distal end portions projecting axially toward the semiconductor device and overhanging radially inwardly, the spherical lens being press-fitted between the teeth.

Each of the teeth has a radially inner surface made up of at least three curved surfaces having respective different radii of curvature. The three curved surfaces include a first curved surface serving as a lens seat surface, positioned at the proximal ends of the teeth, for positioning the spherical lens, the lens seat surface having a radius of curvature which is the same as the radius of the spherical lens, a second intermediate curved surface serving as a non-contact surface, contiguous to the lens seat surface, which is held out of contact with the spherical lens when the spherical lens is press-fitted between the teeth, the non-contact surface having a radius of curvature smaller than the radius of the spherical lens, and a third curved surface serving as a lens presser surface, positioned at the distal ends of the teeth and contiguous to the non-contact surface, for smoothly introducing the spherical lens between the teeth, the third curved surface being curved in a direction opposite to the first and second curved surfaces. Each of the teeth has a radially outer surface inclined to a longitudinal direction of the housing such that the proximal end thereof is spread radially outwardly from the distal end thereof. The housing has a portion which surrounds the teeth and is recessed to a depth which is 5/8–7/8 of the diameter of the spherical lens, the radially outer surface of each of the teeth having a round surface at the proximal end thereof.

The housing preferably has three teeth equally angularly spaced around the optical axis. The radially outer surface of each of the teeth is inclined to the longitudinal direction of the housing at an angle of about 10° such that the proximal end thereof is spread radially outwardly from the distal end thereof. The portion of the housing which surrounds the teeth is recessed to a depth which is approximately ¾ of the diameter of the spherical lens. The round surface of the radially outer surface of each of the teeth has a radius of curvature which is about 0.5 mm.

The housing may be made of a liquid crystal polymer and glass beads having an average diameter of at most 30 μm and uniformly dispersed in the liquid crystal polymer.

The above and other objects, features, and advantages of the present invention will become apparent from the following description when taken in conjunction with the accompanying drawings which illustrate a preferred embodiment of the present invention by way of example.

DETAILED DESCRIPTION OF THE PREFERRED EMBODIMENT

Figure 1:
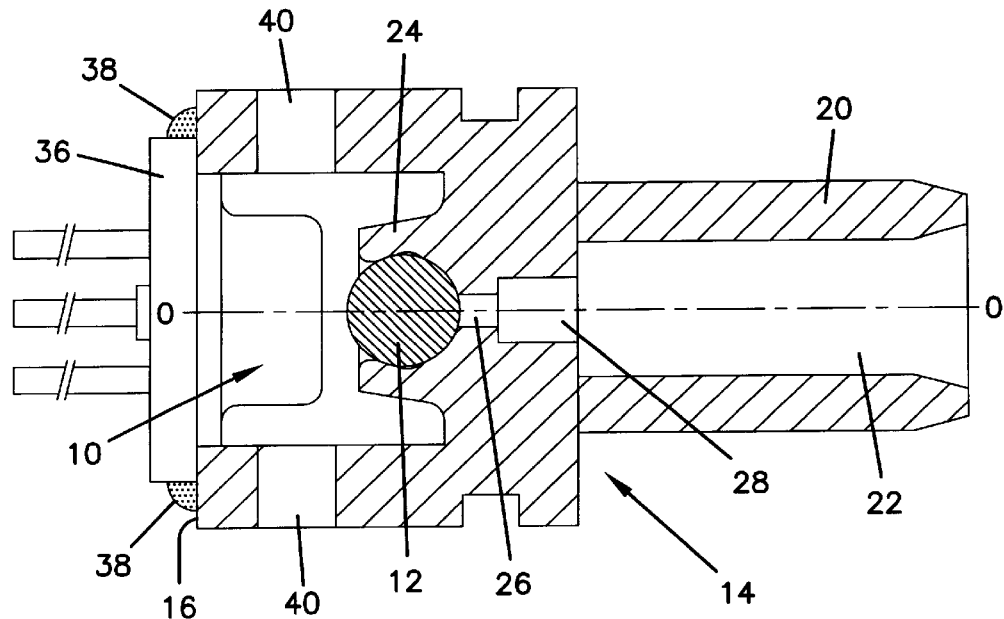
FIG. 1 is a longitudinal cross-sectional view of an optical module according to the present invention.

As shown in FIG. 1, an optical module according to the present invention comprises a hermetically sealed semiconductor device 10, a spherical lens 12, and a housing 14 of synthetic resin which holds the semiconductor device 10 and the spherical lens 12 and has a structure for fittingly holding the ferrule of an optical plug to be connected thereto. When the optical plug is connected to the optical module, the semiconductor device 10 is optically coupled to the optical fiber in the ferrule by the spherical lens 12.

The housing 14 comprises a molded unitary body which is substantially cylindrical in shape. The housing 14 has an end 16 (left-hand side in FIG. 1) on which the semiconductor device 10 is mounted, a central holder region in which the spherical lens 12 is securely mounted, and a receptacle 20 extending from the central holder region toward an opposite end remote from the end 16. The receptacle 20 has a bore 22 defined therein for fittingly holding the ferrule of the optical plug to be connected thereto.

Figure 2:
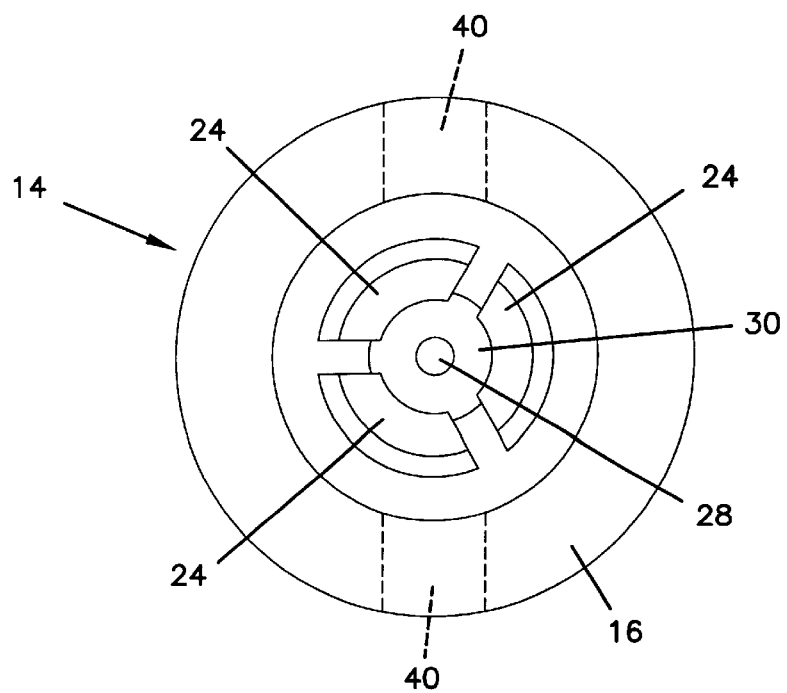
FIG. 2 is an end elevational view of a housing of the optical module, showing an end thereof where a spherical lens will be press-fitted.

The central holder region has a plurality of teeth 24 equally angularly spaced around an optical axis O—O of the housing 14 and having respective distal end portions projecting axially toward the semiconductor device 10 and overhanging radially inwardly. As shown in FIG. 2, there are three angularly equally spaced teeth 24 each arcuate in shape when viewed in end elevation. The central holder region also has a smaller-diameter central hole 26 and a larger-diameter central hole 28 which are defined axially successively therein in alignment with the optical axis O—O and extend from inner proximal end surfaces of the teeth 24 toward the bore 22. These central holes 26, 28 provide a path for a light beam between the bore 22 and the spherical lens 12.

Figure 4:
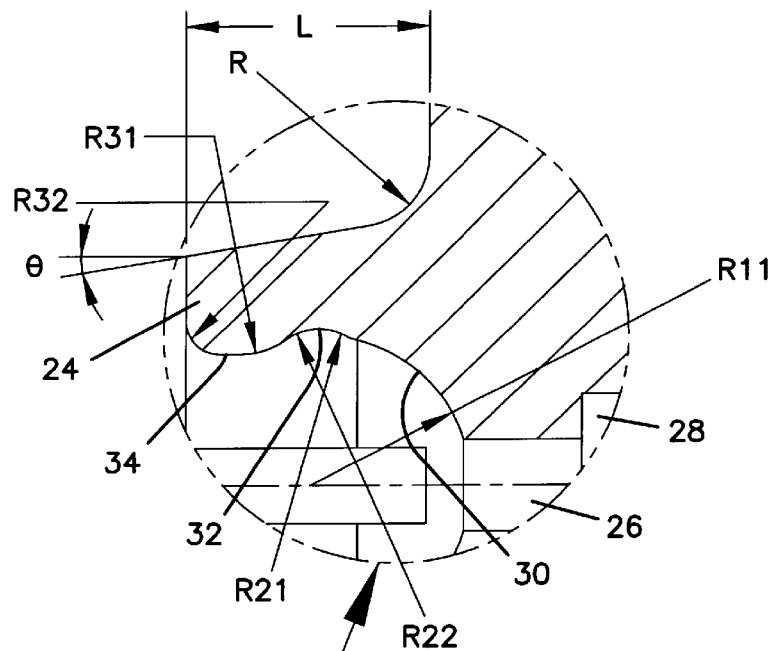
FIG. 4 is an enlarged cross-sectional view of an encircled portion of the housing shown in FIG. 3.
Figure 3:
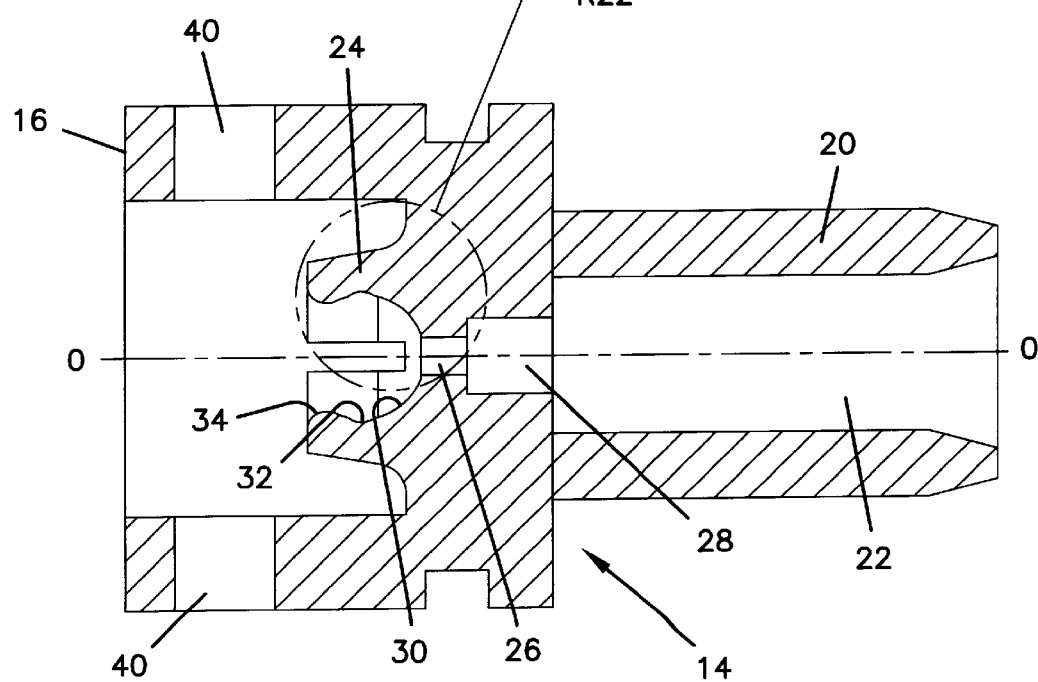
FIG. 3 is a longitudinal cross-sectional view of the housing of the optical module.

In the illustrated embodiment, the spherical lens 12 has a radius r of 1.00 mm. Each of the teeth 24 which hold the spherical lens 12 has a radially inner surface made up of at least three curved surfaces having respective different radii of curvature. Specifically, as shown in FIGS. 3 and 4, the first curved surface serves as a concave lens seat surface 30, positioned at the proximal ends of the teeth 24, for positioning the spherical lens 12, the concave lens seat surface 30 having a radius R11 of curvature which is the same as the radius r of the spherical lens 12 (R11=r=1.00 mm). The second intermediate curved surface serves as a concave non-contact surface 32, contiguous to the lens seat surface 30, which will be held out of contact with the spherical lens 12 when it is press-fitted into the central holder region, the non-contact surface 32 having radii of curvature smaller than the radius r of the spherical lens 12. More specifically, the non-contact surface 32 is made up of two curved surfaces having respective radii R21 (=0.714 mm), R22 (=0.528 mm) of curvature. The third curved surface serves as a convex lens presser surface 34, positioned at the distal ends of the teeth 24 and contiguous to the non-contact surface 32, for smoothly introducing the spherical lens 12 into the central holder region. The lens presser surface 34 is made up of two curved surfaces having respective radii R31 (=1.000 mm), R32 (=0.250 mm) of curvature. When the spherical lens 12 is mounted in the central holder region, the spherical lens 12 is gripped by the lens presser surface 34 and the lens seat surface 30.

Each of the teeth 24 has a radially outer surface inclined to the longitudinal direction of the housing 14 at an angle θ of about 10° such that the proximal end thereof is spread radially outwardly from the distal end thereof. The teeth 24 axially project from a radial end surface of the central holder region by a length L which is about 5/8–7/8, preferably ¾, of the diameter of the spherical lens 12 (L≈3r/2). Stated otherwise, the portion of the central holder region which surrounds the teeth 34 is deeply recessed to the depth L. The radially outer surface of each of the teeth 24 has a round surface at the proximal end thereof, which has a radius R (≈0.5 mm) of curvature. The teeth 24 thus shaped are mechanically strong and flexible enough when the teeth 24 are elastically deflected radially outwardly as the spherical lens 12 is press-fitted between the teeth 24, and also exert sufficient radially inward forces to grip the spherical lens 12 firmly when the teeth 24 recover radially inwardly. Specifically, the inclined radially outer surfaces of the teeth 24 are effective in preventing the intermediate portions thereof from being reduced in thickness, i.e., in uniformizing the thickness of the teeth 24 for thereby dispersing the load exerted when the spherical lens 12 is press-fitted. The portion of the central holder region which surrounds teeth 34 is deeply recessed to the depth L to allow the teeth 34 to be elastically deflected radially outwardly when the spherical lens 12 is press-fitted. In addition, the round surface at the proximal end of the radially outer surface of each of the teeth 24 provides sufficient radially inward forces when the teeth 24 recover radially inwardly after the spherical lens 12 is press-fitted.

Each of the teeth 24 is integrally molded with the housing 14 when it is injection-molded. The housing 14 with the teeth 24 is injection-molded in an injection molding machine including a molding cavity and a core pin which is insertable centrally into the molding cavity. The core pin has a plurality of angularly spaced recesses defined in a proximal portion of a spherical end thereof. When a synthetic resin is injected into the molding cavity, the synthetic resin is molded to shape with the recesses in the core pin forming the respective overhanging portions of the teeth 24. Thereafter, the core pin is forcibly pulled out when the molded housing 14 is removed from the molding cavity.

The housing 14 should preferably be made of a synthetic resin material of high toughness for allowing the spherical lens 12 to be easily press-fitted and also for reliably holding the spherical lens 12 in position. Any dimensional errors of the receptacle 20 need to be reduced to a tolerance of about 5/1000 mm in a temperature range from −20 to +75° C. Therefore, the housing 14 should preferably be made of a synthetic resin material having a small coefficient of linear expansion of about $2 \times 10^{-5}/°$ C. Depending on the temperature at which the optical module is used, the housing 14 may be made of a synthetic resin material having a coefficient of linear expansion up to about $7 \times 10^{-5}/°$ C. The synthetic resin material that meets such requirements is known as engineering plastic, and may be liquid crystal polymer (LCP), polyetheretherketone (PEEK), polyetherimide, polyphenylene sulfide (PPS), polybutylene terephthalate (PBT), polybutylene ether (PPE), polycarbonate (PC), or polyamide. If the coefficient of linear expansion of the synthetic resin material that has been selected is too large, then it may be mixed with a glass filler or glass beads. The glass beads that are used should preferably have an average diameter of 30 μm or less. Though glass beads of smaller diameters are more preferable, they are more expensive.

In an experiment, a liquid crystal polymer in which glass beads having an average diameter ranging from 2 to 20 μm were dispersed exhibited good results. More specifically, the housing 14 was molded of a low-anisotropygrade liquid crystal polymer in which 50% by weight of glass beads having an average diameter of 20 μm were dispersed. The liquid crystal polymer itself had a large anisotropy with respect to coefficients of linear expansion because its coefficient of linear expansion in the direction in which the liquid crystal polymer flows upon injection molding was almost nil, whereas its coefficient of linear expansion perpendicular to that direction was $8 \times 10^{-5}/°$ C. When the liquid crystal polymer was mixed with the glass beads, the anisotropy with respect to coefficients of linear expansion was reduced because its coefficients of linear expansion in the direction in which the liquid crystal polymer flows upon injection molding and in the direction perpendicular thereto were $2 \times 10^{-5}/°$ C. In the housing 14 thus molded, any variations of the inside diameter (2.5 mm) of the receptacle 20 were held to 0.005 mm in the temperature range from −20 to +75° C. in which the optical module was used.

The spherical lens 12 is fixed in position as follows: The housing 14 is vertically oriented with the end 16 up, and the spherical lens 12 is inserted through the end 16 and placed on the distal ends of the teeth 24. Then, a rod-like presser is pressed against the spherical lens 12 to press-fit the spherical lens 12 between the teeth 24. As the spherical lens 12 is forced toward the hole 26, the teeth 24 are elastically flexed radially outwardly by the spherical lens 12. When the spherical lens 12 abuts against and is positioned by the lens seat surface 30, the teeth 24 spring back radially inwardly to restore their original shape. The spherical lens 12 is firmly gripped by the lens seat surface 30 and the radially inward forces exerted by the teeth 24 as they tend to restore their original shape. Since the spherical lens 12 is firmly held in position, the spherical lens 12 remains securely held in position even when the resin material of the housing 14 expands due to a rise in the ambient temperature.

A prototype of the optical module was manufactured. When the spherical lens 12 was pushed by a rod inserted through the bore 22, the teeth 24 had a strength ranging from 15 to 20 kgf against removal of the spherical lens 12. Since the radius of curvature of the lens seat surface 30 is the same as the radius of the spherical lens 12, the spherical lens 12 was positioned along the optical axis O—O with an accuracy error of ±0.01 mm with respect to the design value. From the standpoint of optical design, the distance from a laser beam emission source to the surface of the spherical lens 12 along the optical axis O—O is an important consideration, and the ability to accurately control this distance results in reducing variations in optical characteristics of the optical module.

After the spherical lens 12 is installed in the housing 14, the semiconductor device 10 is coupled to the housing 14. The semiconductor device 10 has a semiconductor element encased in a hermetic package. As shown in FIG. 1, the semiconductor device 10 has a base 36, and the hermetic package is inserted in the housing 14 with the base 36 held against the end 16 of the housing 14. After the semiconductor device 10 is coaxially aligned with the spherical ball 12, the semiconductor device 10 is bonded to the housing 14 by an adhesive 38 of thermosetting synthetic resin applied to an outer circumferential surface of the base 36 and the end 16.

The semiconductor device 10 may comprise a light-emitting device such as a semiconductor laser, a light-emitting diode, or the like, or a light-detecting device such as a photodiode, a photodiode with a built-in preamplifier, or the like.

When an optical plug is connected to the optical module, the ferrule of the optical plug is fitted in the receptacle 20. An optical fiber in the ferrule is aligned coaxially with the optical axis O—O and has an end positioned adjacent to the hole 28. If the semiconductor device 10 is a semiconductor laser, then a laser beam emitted from the semiconductor laser is applied to and focused by the spherical lens 12 onto the end of the optical fiber in the ferrule. The smaller-diameter central hole 26 opening at the center of the lens seat surface 30 has its diameter set to a minimum value required to pass only a laser beam that needs to be transmitted to the optical fiber in the ferrule while removing unwanted light caused by aberrations of the spherical lens 12. Conversely, if the semiconductor device 10 is a photodiode, then a light beam emitted from the end of the optical fiber in the ferrule is applied to and focused by the spherical lens 12 onto the photodiode.

The housing 14 has a pair of diametrically opposite through holes 40 defined in a side wall thereof between the end 16 and the spherical ball 12. The holes 40 allow air to flow therethrough into and out of the housing 14 thereby to prevent moisture from being condensed within the housing 14 due to changes in the ambient temperature. Preferably, if the internal volume of the housing 14, which represents an amount of air that can flow into and out of the housing 14, is about 40 mm$^3$, then the holes 40 have a total opening area of about 1.8 mm$^3$. Three or more through holes may be defined in the size wall of the housing 14.

For jobs that handle semiconductor devices, it is the general practice to humidify the ambient air to keep a humidity range from 50 to 60% RH for preventing the semiconductor devices from being broken due to electrical surges. If there were no through holes 40, the humid ambient air would be trapped within the housing 14 when the semiconductor device 10 is installed on the housing 14. The optical module is often guaranteed to be able to operate or be kept on the shelf in a temperature range from −40 to +85° C. If the optical module with the humid ambient air trapped within the housing 14 were placed at temperatures lower than +5° C., then the moisture would tend to be condensed in the housing 14, and condensed droplets would be applied to the spherical lens 12 and/or the window glass of the semiconductor device 10, resulting in a reduction in the intensity of the beam transmitted through the window glass or the spherical lens 12. In addition, at the time of manufacturing the optical module, when the semiconductor device 10 is bonded to the housing 14 by the adhesive 38 of thermosetting synthetic resin and locally heated by high-frequency heating, moisture also tends to be condensed on the spherical lens 12 due to the difference between the temperature (about 200° C.) of the semiconductor device 10 and the temperature (about 20° C.) of the spherical lens 12.

If the housing 14 were of a sealed structure, therefore, moisture would tend to be condensed in the housing 14, resulting in poor optical characteristics. According to the present invention, however, since the through holes 40 are defined in the side wall of the housing 14 and the total opening area of the through holes 40 is commensurate with the internal volume of the housing 14, air flows into and out of the housing 14 when the optical module is operating or is kept on the shelf, thus preventing moisture from being condensed in the housing 14 and also eliminating droplets that happen to be condensed in the housing 14. Even when moisture is condensed on the spherical lens 12 due to localized heating at the time of manufacturing the optical module, the condensed droplets can be removed from the spherical lens 12 by subsequently heating the optical module to about 100° C. for 15 minutes, for example. Accordingly, the through holes 40 are effective in preventing the optical module from becoming defective when manufactured and also from suffering degraded optical characteristics while being used or kept on the shelf.

In the illustrated embodiment, the housing 14 includes the receptacle 20 integrally molded therewith. Alternatively, the housing 14 may be dispensed with the receptacle 20, or may have a separate receptacle which is subsequently joined. The separate receptacle may be made of a material highly durable against repeated insertion and removal of the ferrule of an optical plug.

The numerical values given above as the various radii of curvature of the curved surfaces are optimum values for use with a spherical lens whose radius is 1.00 mm. If a spherical lens having a different radius is used, then the curved surfaces may have corresponding radii of curvature. While each of the first through curved surfaces comprises a three-dimensional curved surface in the illustrated embodiment, it may be a quasi-curved surface comprising a combination of flat facets.

The optical module according to the present invention may be made of a relatively small number parts because the teeth are integrally formed with the housing. Since the spherical lens is purely mechanically fixed to the housing without the use of any adhesive or fusible glass, no such adhesive or fusible glass is applied to the lens surface, and the optical module is highly weather-resistant. The spherical lens can be handled easily because it can be installed in position in the housing simply by being placed on the teeth and press-fitted with a rod-like presser. Because no separate component is needed to secure the spherical lens in place in the housing and the spherical lens can be installed easily, the optical module can be manufactured inexpensively.

The teeth are designed for increased mechanical strength thereof and also designed for holding the spherical lens snugly in place. As a result, the spherical lens is securely held in place with increased accuracy, and the teeth are resistant to damage or breakage when the spherical lens is press-fitted. The teeth are thus effective in holding the spherical lens highly firmly.

Although certain preferred embodiments of the present invention have been shown and described in detail, it should be understood that various changes and modifications may be made therein without departing from the scope of the appended claims.

What is claimed is:

1. An optical module comprising:

a housing of synthetic resin;

a semiconductor device supported by said housing; and a spherical lens held in said housing;

said housing having a plurality of teeth angularly spaced around an optical axis of the housing and having respective distal end portions projecting axially toward said semiconductor device and overhanging radially inwardly, said spherical lens being press-fitted between said teeth;

each of said teeth having a radially inner surface made up of at least three curved surfaces having respective different radii of curvature, said at least three curved surfaces including a first curved surface serving as a lens seat surface, positioned at the proximal ends of the teeth, for positioning said spherical lens, said lens seat surface having a radius of curvature which is the same as the radius of said spherical lens, a second intermediate curved surface serving as a non-contact surface, contiguous to said lens seat surface, which is held out of contact with said spherical lens when the spherical lens is press-fitted between said teeth, said non-contact surface having a radius of curvature smaller than the radius of said spherical lens, and a third curved surface serving as a lens presser surface, positioned at the distal ends of the teeth and contiguous to said non-contact surface, for smoothly introducing said spherical lens between said teeth, said third curved surface being curved in a direction opposite to said first and second curved surfaces, each of said teeth having a radially outer surface inclined to a longitudinal direction of said housing such that the proximal end thereof is spread radially outwardly from the distal end thereof, said housing having a portion which surrounds said teeth and is recessed to a depth which is $\frac{5}{8}$–$\frac{7}{8}$ of the diameter of said spherical lens, said radially outer surface of each of said teeth having a round surface at the proximal end thereof.

2. An optical module comprising:

a housing of synthetic resin;

a semiconductor device supported by said housing; and a spherical lens held in said housing;

said housing including a portion for fittingly holding a ferrule of an optical plug to be connected thereto, so that when the optical plug is connected to said housing, said semiconductor device and an optical fiber in the ferrule are optically coupled to each other by said spherical lens;

said housing having a plurality of teeth angularly spaced around an optical axis of the housing and having respective distal end portions projecting axially toward said semiconductor device and overhanging radially inwardly, said spherical lens being press-fitted between said teeth;

each of said teeth having a radially inner surface made up of at least three curved surfaces having respective different radii of curvature, said at least three curved surfaces including a first curved surface serving as a lens seat surface, positioned at the proximal ends of the teeth, for positioning said spherical lens, said lens seat surface having a radius of curvature which is the same as the radius of said spherical lens, a second intermediate curved surface serving as a non-contact surface, contiguous to said lens seat surface, which is held out of contact with said spherical lens when the spherical lens is press-fitted between said teeth, said non-contact surface having a radius of curvature smaller than the radius of said spherical lens, and a third curved surface serving as a lens presser surface, positioned at the distal ends of the teeth and contiguous to said non-contact surface, for smoothly introducing said spherical lens between said teeth, said third curved surface being curved in a direction opposite to said first and second curved surfaces, each of said teeth having a radially outer surface inclined to a longitudinal direction of said housing such that the proximal end thereof is spread radially outwardly from the distal end thereof, said housing having a portion which surrounds said teeth and is recessed to a depth which is 5/8–7/8 of the diameter of said spherical lens, said radially outer surface of each of said teeth having a round surface at the proximal end thereof.

3. An optical module according to claim 1, wherein said housing has three teeth equally angularly spaced around said optical axis, said radially outer surface of each of the teeth being inclined to the longitudinal direction of said housing at an angle of about 10° such that the proximal end thereof is spread radially outwardly from the distal end thereof, said portion of the housing which surrounds said teeth being recessed to a depth which is approximately 3/4 of the diameter of said spherical lens, said round surface of said radially outer surface of each of said teeth having a radius of curvature which is about 0.5 mm.

4. An optical module according to claim 1, wherein said housing is made of a liquid crystal polymer and glass beads having an average diameter of at most 30 μm and uniformly dispersed in said liquid crystal polymer.

5. An optical module according to claim 2, wherein said housing has three teeth equally angularly spaced around said optical axis, said radially outer surface of each of the teeth being inclined to the longitudinal direction of said housing at an angle of about 10° such that the proximal end thereof is spread radially outwardly from the distal end thereof, said portion of the housing which surrounds said teeth being recessed to a depth which is approximately 3/4 of the diameter of said spherical lens, said round surface of said radially outer surface of each of said teeth having a radius of curvature which is about 0.5 mm.

6. An optical module according to claim 2, wherein said housing is made of a liquid crystal polymer and glass beads having an average diameter of at most 30 μm and uniformly dispersed in said liquid crystal polymer.

\* \* \* \* \*